United States Patent
Zheng (10) Patent No.: US 7,979,036 B2
(45) Date of Patent: Jul. 12, 2011

(54) FULLY INTEGRATED ULTRA WIDEBAND TRANSMITTER CIRCUITS AND SYSTEMS

(75) Inventor: Yuan Jin Zheng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 790 days.

(21) Appl. No.: 11/813,047

(22) PCT Filed: Dec. 30, 2004

(86) PCT No.: PCT/SG2004/000429
§ 371 (c)(1),
(2), (4) Date: Mar. 13, 2008

(87) PCT Pub. No.: WO2006/071197
PCT Pub. Date: Jul. 6, 2006

(65) Prior Publication Data
US 2009/0021309 A1  Jan. 22, 2009

(51) Int. Cl.
*H03C 1/52* (2006.01)

(52) U.S. Cl. .......... 455/102; 455/118; 455/91; 375/146; 375/295; 332/115; 332/176

(58) Field of Classification Search .......... 455/424, 455/425, 456.5, 456.6, 561, 550.1, 575.1, 455/63.1, 67.13, 333, 332, 127.3, 91, 102, 455/118; 330/265, 295, 264, 300, 251; 375/295, 375/130, 371, 296, 146, 242, 259, 334, 338, 375/354; 327/348, 304; 332/176, 106–116
See application file for complete search history.

(56) References Cited

U.S. PATENT DOCUMENTS

| | | | | |
|---|---|---|---|---|
| 3,649,925 A | * | 3/1972 | Besser | 330/265 |
| 3,699,465 A | * | 10/1972 | Pranke | 330/271 |
| 3,832,568 A | * | 8/1974 | Wang | 307/106 |
| 5,206,541 A | * | 4/1993 | Boahen et al. | 706/33 |

(Continued)

FOREIGN PATENT DOCUMENTS

| JP | 2000-101408 | 4/2000 |
|---|---|---|
| JP | 2002-043866 | 2/2002 |
| JP | 2004-187113 | 7/2004 |

OTHER PUBLICATIONS

Ayadi J., et al, Ultra-Wideband Investigations for Low Data Rate Wireless Personal Area Network, Centre Suisse d'Electronique et deMicrotechnique (CSEM) Wireless Communications Section, Switzerlan, SETIT 2004, Mar. 12-20, 2004.

(Continued)

*Primary Examiner* — Duc M Nguyen
*Assistant Examiner* — Charles Chow
(74) *Attorney, Agent, or Firm* — K. David Crockett, Esq.; Niky Economy Syrengelas, Esq.; Crockett & Crockett, PC (57) ABSTRACT

Disclosed is a novel design of a fully integrated UWB transmitter. The transmitter includes a pulse generator, a pulse modulator, and an ultra-wideband drive amplifier. A new low voltage low power pulse generator circuit is disclosed which can be fully integrated in CMOS or BiCMOS process. This circuit includes a squaring stage, an exponential stage, and a second-order derivative stage. Based on this, PPM, BPSK and PAM pulse modulator circuits and system are disclosed. The modulated pulse is symmetrical second-order derivative Gaussian pulses with a bandwidth up to 5 GHz and having sufficient swing for UWB applications. An ultra-wideband driver amplifier is proposed to amplify the modulator output and drive the antenna. For the driver amplifier, common source resistor and inductor shunt feedback with current reuse technique is employed to achieve the ultra-wideband bandwidth, high gain, and providing matching for the antenna simultaneously.

35 Claims, 5 Drawing Sheets

U.S. PATENT DOCUMENTS

| | | | |
|---|---|---|---|
| 5,585,757 A * | 12/1996 | Frey | 327/348 |
| 5,657,025 A * | 8/1997 | Ebner et al. | 701/300 |
| 6,026,125 A * | 2/2000 | Larrick et al. | 375/295 |
| 6,057,737 A * | 5/2000 | Pritchard | 330/300 |
| 6,552,610 B1 * | 4/2003 | Grebennikov et al. | 330/251 |
| 6,639,461 B1 * | 10/2003 | Tam et al. | 330/10 |
| 6,670,850 B1 | 12/2003 | Roach | |
| 6,865,399 B2 * | 3/2005 | Fujioka et al. | 455/553.1 |
| 6,940,353 B2 * | 9/2005 | Moraveji | 330/264 |
| 7,412,007 B1 * | 8/2008 | Richley et al. | 375/296 |
| 2003/0227980 A1 * | 12/2003 | Batra et al. | 375/295 |
| 2004/0071249 A1 * | 4/2004 | Schell | 375/371 |
| 2004/0113697 A1 * | 6/2004 | Pengelly et al. | 330/295 |
| 2008/0109190 A1 * | 5/2008 | Bauer et al. | 702/189 |
| 2009/0224813 A1 * | 9/2009 | Kuthi et al. | 327/304 |
| 2010/0046581 A1 * | 2/2010 | Oh et al. | 375/130 |
| 2010/0156195 A1 * | 6/2010 | Sanders et al. | 307/108 |

OTHER PUBLICATIONS

Lou X., et al., Designing Optimal Pulse-Shapers for Ultra-Wideband Radios, Journal of Communications and Networks, vol. 5, No. 4, Dec. 2003.

Terada T., et al., Transceiver Circuits for Pulse-Based Ultra-Wideband, Department of Electrical Engineering, Keiko University, Japan, IEEE ISCAS 2004.

Dewwent World Patent Abstracts, Accession No. 87-305054/43, class U23, SU 1298-935 A (AGARKOVE E. V. Mar. 23, 1987.

* cited by examiner

FULLY INTEGRATED ULTRA WIDEBAND TRANSMITTER CIRCUITS AND SYSTEMS

BACKGROUND

The present invention relates to transmitter circuits and systems, and more particularly to ultra wideband transmitter circuits and systems.

Ultra-wide band (UWB) is a new and promising technology for high speed, short range and portable wireless communication systems and devices. UWB technology enables new opportunities in the development of short range and high data rate wireless communication applications such as wireless Personal Area Network (PAN), interactive gaming, office networking and indoor communications.

The design of the building blocks of the UWB wireless transceiver is very demanding due to its simultaneous requirements for ultra-wide bandwidth, high speed, high throughput, low interference and low power consumption. Critical to operation is the generation of vary narrow pulses (typically 0.2-2 nano-seconds) onto which information is modulated. It is extremely difficult to generate sub-nanosecond pulses in pulse generator/modulator circuits whether the circuit be formed either from discrete components due to interconnection discontinuities, and capacitive coupling between components, or in an integrated circuit due to the low isolation and low current gain of the complementary metal oxide semiconductor (CMOS) or bipolar-complementary metal oxide semiconductor (BiCMOS) processes.

Furthermore, the pulse generator/modulator output is often times too low to drive the antenna, and accordingly a matching network is many times necessary to provide optimal impedance matching to the UWB antenna. Typically however, the matching circuit is not as broadband as the UWB spectrum (e.g., 3.1-10.6 GHz in the U.S), and thus power loss due to impedance mismatch occurs over some part of the transmission band. Additionally, broadband matching networks are typically quite lossy, and thus provide diminishing returns on bandwidth versus output power.

Accordingly, a need exists for improved UWB transmitter circuits and systems, and which are preferably capable of monolithic integration using CMOS or BiCMOS semiconductor processes.

SUMMARY

The present invention provides UWB transmitter circuits including a Gaussian pulse generator, an ultra wideband modulator which is based upon the Gaussian pulse generator design, and a driver amplifier. The modulator circuit is configured to provide second-order derivative Gaussian pulses. The driver amplifier is used to provide gain and a broadband impedance matching between the modulator circuit and transmitting antenna such that the modulated UWB pulse is transmitted with high power and low distortion. The aforementioned circuits can be either fabricated separately, or integrated into a UWB transmitter circuit, or alternately formed in a monolithic integrated circuit using, for example, CMOS or BiCMOS semiconductor processing.

The Gaussian pulse generator circuit, in an exemplary embodiment, includes a squaring stage, an exponential stage, and a second-order derivative stage. The squaring stage includes a first transistor which is configured to operate in the transistor's saturation region. The exponential stage includes a second transistor coupled to the first transistor, the second transistor configured to operate in the transistor's sub-threshold region. The second-order derivative stage includes a capacitive-inductive network coupled to the second transistor, and an output terminal, wherein, when a load is coupled to the output terminal, the real resistance of the load combines with the capacitive-inductive network to provide a second order derivative response.

The ultra wideband modulator circuit includes the above-described Gaussian pulse generator circuit and a modulation control circuit. The modulator control circuit includes an input configured to receive a control signal and an output coupled to the Gaussian pulse generator circuit, whereby the modulation control circuit operates to modulate the biasing condition of the exponential stage as a function of the control signal.

The design of the ultra wideband driver amplifier circuit includes a plurality of serial-coupled amplifier stages, each amplifier stage having parallel coupled first and second amplifier stage transistors and a feedback network. Each of the first and second amplifier stage transistors having first, second and third terminals, whereby the first terminals of the first and second amplifier stage transistors are coupled together at a first node, and the third terminal of the first amplifier stage transistor and the second terminal of the second amplifier stage transistor are coupled together at a second node. The feedback network, which includes inductive and resistive elements, is coupled between the first and second nodes.

The ultra wideband transmitter circuit includes the above-described ultra wideband modulator circuit and the driver amplifier circuit. In a particular embodiment, the transmitter circuit is fabricated as an integrated circuit using either a BiCMOS or CMOS semiconductor process.

These and other features of the invention will be better understood when viewed in light of the following drawings and detailed description.

For clarity, previously identified features retain their reference indicia in subsequent drawings.

DETAILED DESCRIPTION OF SPECIFIC EMBODIMENTS

A fully integrated UWB transmitter is presented which includes a pulse modulator, an ultra-wideband drive amplifier and an antenna. A low voltage, low power pulse generator circuit is presented which can be fully integrated in CMOS or BiCMOS process. Based upon the fully integrated pulse generator circuit, new PPM, BPSK and PAM pulse modulator circuits and system are constructed. The modulated pulse is symmetrical second-order derivative Gaussian pulses with a bandwidth up to 5 GHz and having sufficient swing for UWB applications. The ultra-wideband driver amplifier is used to amplify the modulator output and drive the antenna. Additionally, a new design of shunt feedback current reuse common source driver amplifier with resistor and inductor feedback is proposed to achieve the ultra-wideband bandwidth, high gain, and providing matching for the antenna simultaneously. By proper co-design of the modulator, driver amplifier and antenna, the optimum transmitter performance is achieved.

System Overview

Figure 1:
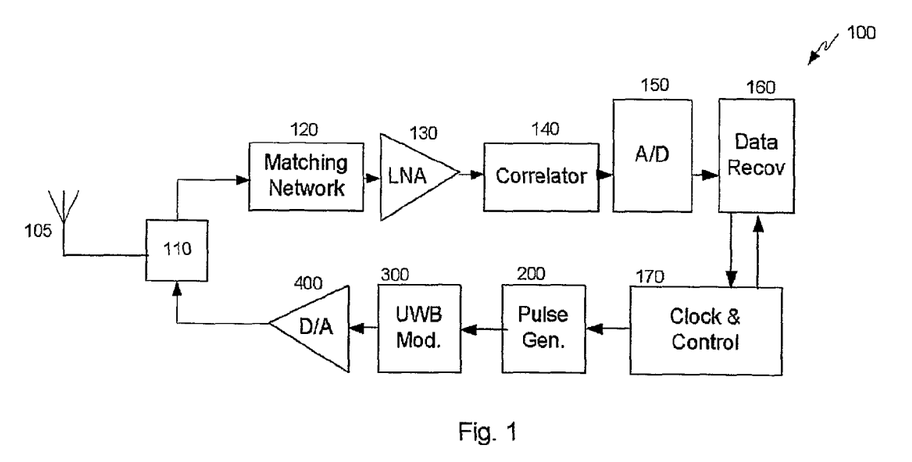
FIG. 1 illustrates a circuit block diagram of a UWB transceiver in accordance with an embodiment of the present invention.

FIG. 1 illustrates a circuit block diagram of a UWB transceiver 100 in accordance with an embodiment of the present invention. The transceiver 100 includes an ultra wideband antenna 105, and receiver components including a matching network 120, low noise amplifier 130, correlator 140, an analog-to-digital converter 150, and data recovery/baseband circuitry 160, for transmitting and receiving UWB signals. Transmitter components include a Gaussian pulse generator 200, UWB modulator 300, and a UWB driver amplifier 400, each of which is further described below. A circulator, diplexer, or switch 110 is used to separate the transmit and receive signals. Synchronization, clock and control signals are provided by means of digital backend circuitry 170.

During receiving operation, an UWB signal is received at the UWB antenna 105, and supplied to the LNA 130, a broadband impedance matching network 120 being used to provide optimal impedance matching between the LNA input and the antenna. The amplified received signal is subsequently supplied to the correlator 140, the correlated output signals being subsequently converted to digital signals and the baseband data recovered therefrom. The digital backend control provides for the clock generation, synchronization and data processing.

During a transmitting operation, the Gaussian pulse generator 200 receives a clock signal, and responsive thereto, produces an ultra wideband Gaussian pulse. The UWB modulator 300 receives and modulates the Gaussian pulse responsive to a received control signal. The UWB driver amplifier 400 amplifies the UWB modulated signal, simultaneously providing broadband impedance matching to the antenna 105 for optimal power transfer. The amplified UWB signal is transmitted from the UWB antenna 105 to a remote UWB receiver.

Gaussian Pulse Generator Circuit

Figure 2:
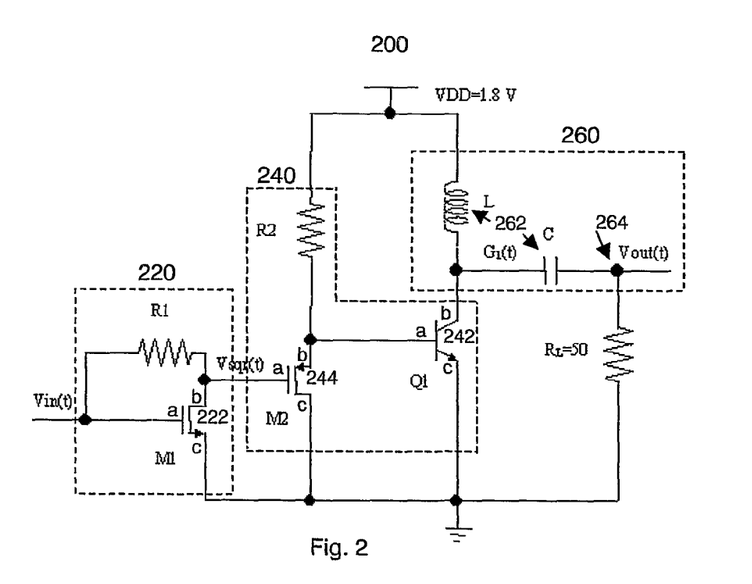
FIG. 2 illustrates a Gaussian pulse generator circuit in accordance with an embodiment of the present invention.

FIG. 2 illustrates an exemplary embodiment of the Gaussian pulse generator circuit 200 in accordance with the present invention. The circuit 200 includes a squaring stage 220, an exponential stage 240, and a second-order derivative stage 260. The squaring function stage 220 includes a first transistor 222 having a first terminal 222a configured to receive an input signal, a second terminal 222b coupled to a first resistor 224, and a third terminal 222c, whereby the first transistor is configured for biasing in the transistor's saturation region. Such a biasing condition provides the squaring function of the input signal as needed.

The exponential stage 240 includes a second transistor 242, a third transistor 244, and a second resistor 246. As shown, the second transistor 242 has a first terminal 242a coupled to the first transistor's second terminal 222b, that connection being made via the third transistor 244. The first terminal 242a is also coupled to the second resistor 246, the second transistor 242 being biased to operate in a sub-threshold region to provide the exponential function of the input signal. The third transistor 244 is employed to level shift the first terminal 242a of the second transistor to the correct voltage.

The second order derivative stage 260 includes a capacitive-inductive network 262 coupled to the second terminal 242b of the second transistor 242 and an output terminal 264, wherein, when a load $R_L$ is coupled to the output terminal, the real resistance of the load $R_L$ combines with the capacitive-inductive network 262 to provide a second order derivative response.

The output of the pulse generator can be regarded as a second-order derivative Gaussian pulse, which can be characterized as:

$$V_{out}(t) \approx -\frac{2k_e R_L L C e^{5V_{th}/4}}{\lambda V_{th}}\left[1-\frac{2}{\lambda V_{th}}\left(V_{in}(t)-\frac{3V_{th}}{2}\right)^2\right]e^{-\frac{(V_{in}(t)-\frac{3V_{th}}{2})^2}{\lambda V_{th}}}$$

where $k_e$ and $\lambda$ are parameters of the exponential I-V characteristic equation: $I_{DS}=k_e e^{V_{GS}/\lambda}$ and are process dependent, $V_{th}$ is the threshold voltage of the first and third (MOSFET) transistors 222 and 244, $R_L$ is the load real resistance, and C and L are respective values of the capacitance and inductance of the capacitive-inductive network.

In the particular embodiment shown, first and third transistors 222 and 244 are n- and p-channel MOSFETs, respectively, and second transistor 242 is a bipolar junction transistor. The power plane is provided at +1.8 VDC and signal ground for each of the transistors is ground potential. An integrated circuit of this arrangement, as will be apparent to those skilled in the art, can be formed using a BiCMOS semiconductor process. Alternatively, an n-channel device biased for operation in its sub-threshold region may replace the bipolar transistor 242, in which case a corresponding integrated circuit may be fabricated using a CMOS semiconductor process.

UWB Modulator Circuit

The Gaussian pulse generator circuit described herein may also be used with or incorporated in the design of an ultra wideband modulator. Several types of modulators for UWB transmitters are known in the art, for example, pulse position modulators (PPMs), pulse amplitude modulators (PAMs), and binary phase shift-keyed (BPSK) modulators.

Figure 3A:
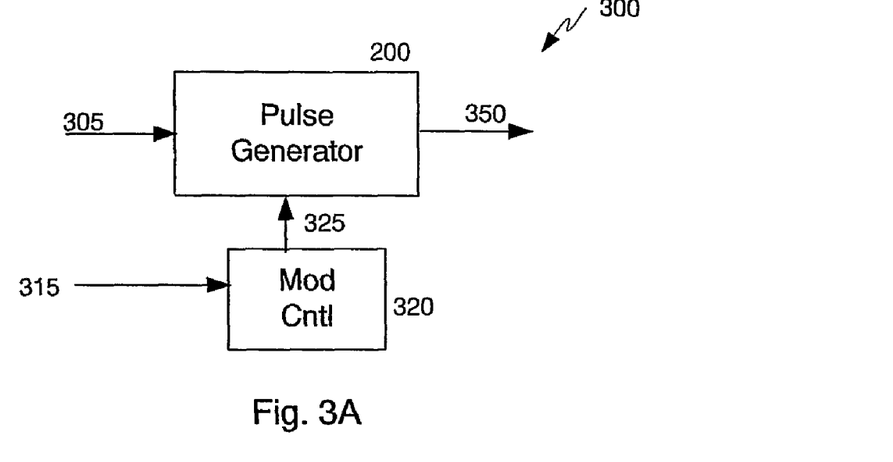
FIG. 3A illustrates a circuit block diagram of an ultra wideband modulator circuit in accordance with one embodiment of the present invention.

FIG. 3A illustrates a circuit block diagram of an ultra wideband modulator circuit 300 in accordance with one embodiment of the present invention. The modulator 300 includes a Gaussian pulse generator circuit 200 and a modulation control circuit 320. The Gaussian pulse generator circuit 200 is configured to receive an input signal 305, which may be a clock signal, and a modulation signal 325 generated from the modulation control circuit 320. The modulation signal 325 is generated as a response to a control signal (typically the data to be modulated on the UWB signal) input into the modulation control circuit 320. Responsive to the modulation signal 325 (which may be a spectrum spreading chip signal), the pulse generator circuit 200 outputs a modulated second-order Gaussian pulse 350. Several variations of the modulation control circuit 320 are possible, depending upon the desired modulation type. For example, the modulation control circuit may comprise a double-pole, single-throw switch that, responsive to a control signal 315, is switchable between two modulation states. The two modulation states may comprise high and low amplitude states in a pulse amplitude modulation scheme, advanced and delayed states in a pulse position modulation scheme, or positive and negative phases in a binary phase shift keyed modulation scheme. Tertiary, quadrature, or higher order switching states are of course possible in other embodiments as well. Further, the pulse generator and modulation control circuits may be separately designed and fabricated, or formed on a monolithic integrated circuit.

Figure 3B:
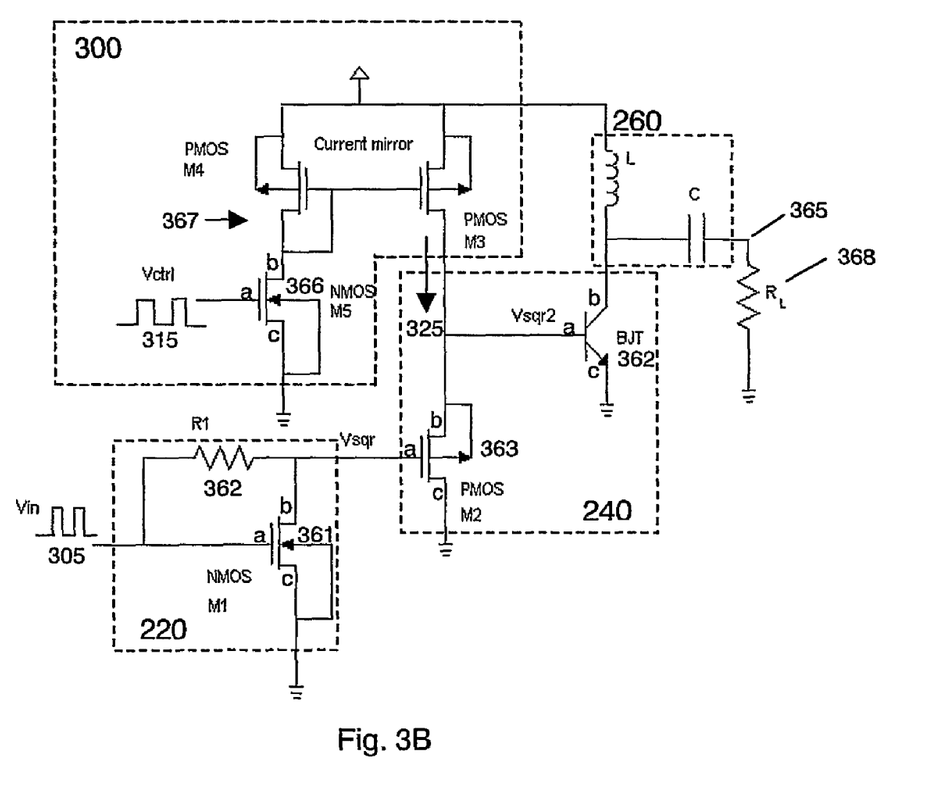
FIG. 3B illustrates an ultra wideband pulse amplitude modulator circuit in accordance with one embodiment of the present invention.

FIG. 3B illustrates a first embodiment of the ultra wideband modulation circuit represented in FIG. 3A, the embodiment representing a UWB pulse amplitude modulation circuit 360. The circuit 360 includes a pulse generator circuit having squaring, exponential, and second-order derivative stages 220, 240 and 260, and a modulation control circuit 320, as described above. The squaring stage of the pulse generator circuit 220 includes a first transistor (e.g., an NMOS FET device) having a first terminal 361a configured to receive the input signal 305, and second and third terminals 361b and 361c, respectively. The squaring stage 220 further includes a resistor 362 coupled to the second terminal 361b of the first transistor 361, the transistor 361 being configured for operation in the saturation region.

The exponential stage 240 includes a second transistor 362 (e.g. a BJT) having a first terminal 362a coupled to the second terminal 361b of the first transistor 361, that connection being made via a third transistor 363. The third transistor 363 (e.g., a PMOS FET) provides sufficient biasing conditions to the second transistor 362, whereby the second transistor 362 operates in the sub-threshold region to produce an exponential response. The second-order derivative stage 260 includes a capacitive-inductive network 364 coupled to the second terminal 362b of the second transistor and an output terminal 365, wherein, when a load $R_L$ is coupled to the output terminal 365, the real resistance of the load $R_L$ 368 combines with the capacitive-inductive network 364 to provide a second order derivative response. In the illustrated embodiment as shown, the third terminals 361c, 362c, and 363c of the first, second and third transistors are coupled to ground potential.

The modulation control circuit 320 includes transistor 366 having an input terminal configured to receive the control signal 315 and a current mirror 367 coupled to the second transistor 362, whereby the responsive to the input control signal 315, the current mirror 367 produces a modulation signal 325 which alters the biasing condition of the second transistor 362. Consequently, the second transistor 362 produces a modulated exponential response, which, in combination with the second order response provided by stage 260, produces a pulse amplitude modulated UWB pulse signal 350. The circuit can be fabricated as either discrete components or as an integrated circuit. When fabricated as an integrated circuit, the illustrated circuit can be monolithically formed using a BiCMOS semiconductor process. Alternatively, an n-channel device biased for operation in its sub-threshold region may replace the bipolar transistor 362, in which case a corresponding integrated circuit may be fabricated using a CMOS semiconductor process.

Figure 3C:
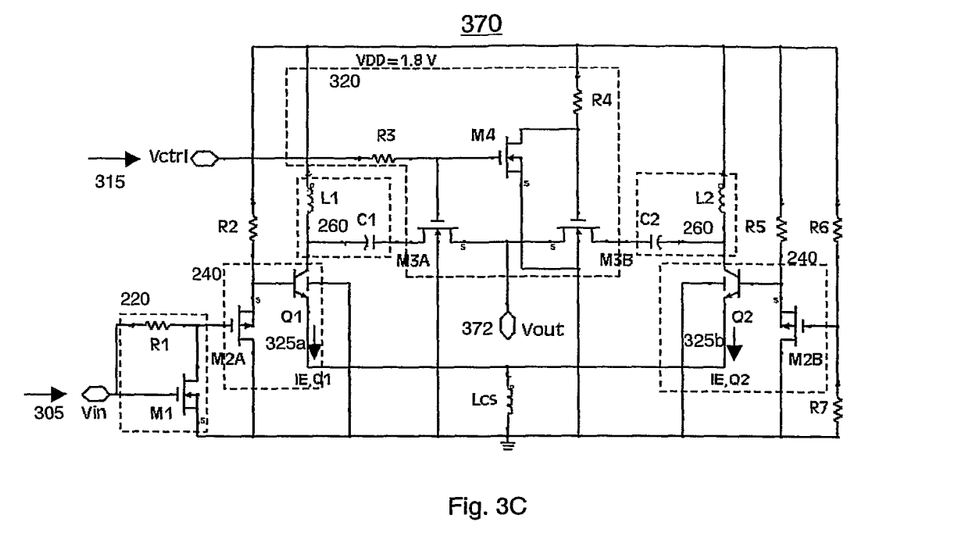
FIG. 3C illustrates an ultra wideband bipolar phase shift keyed modulator circuit in accordance with one embodiment of the present invention.

FIG. 3C illustrates a second embodiment of the ultra wideband modulation circuit represented in FIG. 3A, the embodiment representing a UWB binary phase-shift keyed modulation circuit 370. The circuit 370 includes the aforementioned squaring, exponential and second order derivative stages of the pulse generator circuit and the modulation control stage 320 generally described in FIG. 3A. In this embodiment, the squaring stage 220 includes a first transistor M1 having a first terminal M1a operable to receive the input signal 305 and resistor R1 coupled to the second port M1b, the first transistor M1 being biased for operation in the saturation region. The exponential stage 240 includes, in addition to the second (BJT) transistor Q1 and third (MOSFET) transistor M2A described in FIG. 3B, fourth transistor Q2 and fifth transistor M2B, the second and fourth transistors Q1 and Q2 being arranged as a differential emitter coupled pair degenerated by inductor $L_{CS}$. Each of the second and fourth transistors are biased for operation in sub-threshold regions to provide complementary exponential responses, their bias levels being set by means of third and fifth transistors M2A and M2B, respectively.

The second-order derivative stage 260 also includes two sections, the first capacitive-inductive network (C1 & L1) coupled to the second terminal of the second transistor Q1, and the second capacitive-inductive network (C2 & L2) being coupled to the second terminal of the fourth transistor Q2. The two capacitive-inductive networks are coupled to a common output terminal 372 for connection to the output load.

The modulation control circuit 320 in this embodiment includes sixth, seventh and eighth transistors M4, M3A and M3B and resistors R3 and R4. When a ramp up signal appears at the first terminal of M1, a Gaussian function current flows though the emitter of Q1 then is folded to Q2 by the tail inductor $L_{CS}$. Hence, two Gaussian function signals (currents) 325a and 325b with reverse polarities are achieved. These currents flow to the capacitive-inductive networks, and then the second-order derivative current of Gaussian pulses with reverse polarities are formed at the output of the capacitive-inductive networks. Seventh and eighth transistors M3A and M3B are used as two transmission gates, and are biased by complimentary control voltages. Thus, only one of the modulated currents 325a or 325b will pass through their respective inductive-capacitive networks to the load to form a positive or negative pulse. As can be seen, the polarity of output pulse is determined by the control voltage's level. When level of the control signal 315 is high, e.g. representing a positive phase, the output pulse is positive, and vice versa for a low signal representing a negative phase. In this manner, the complementary phases of a binary phase-shift keyed signal are represented in the generated UWB pulse.

As noted with the other circuits, the circuit may be formed either in discrete components or as an integrated circuit. In the illustrated embodiment in which BJTs and MOSFETs are employed, a BiCMOS process is most suitable. Alternatively, Q1 and Q2 may be replaced with NMOS transistors configured for sub-threshold biasing, and the circuit fabricated as a CMOS integrated circuit.

Pulse position modulation (PPM) represents another UWB modulation technique, whereby a different time lag is used to identify binary 1s and 0s. For example, a long time lag may be used to represent a 1 bit and a short time lag may represent a 0 bit. As indicated in the pulse generator circuit, the pulse is generated by the edge of the input (typically clock) signal. To generate PPM pulses, the edge location of the input clock signal is modulated by the information data (control signal), and subsequently the edge location modulated pulses can be passed through a pulse generator to produce PPM pulses.

Figure 3D:
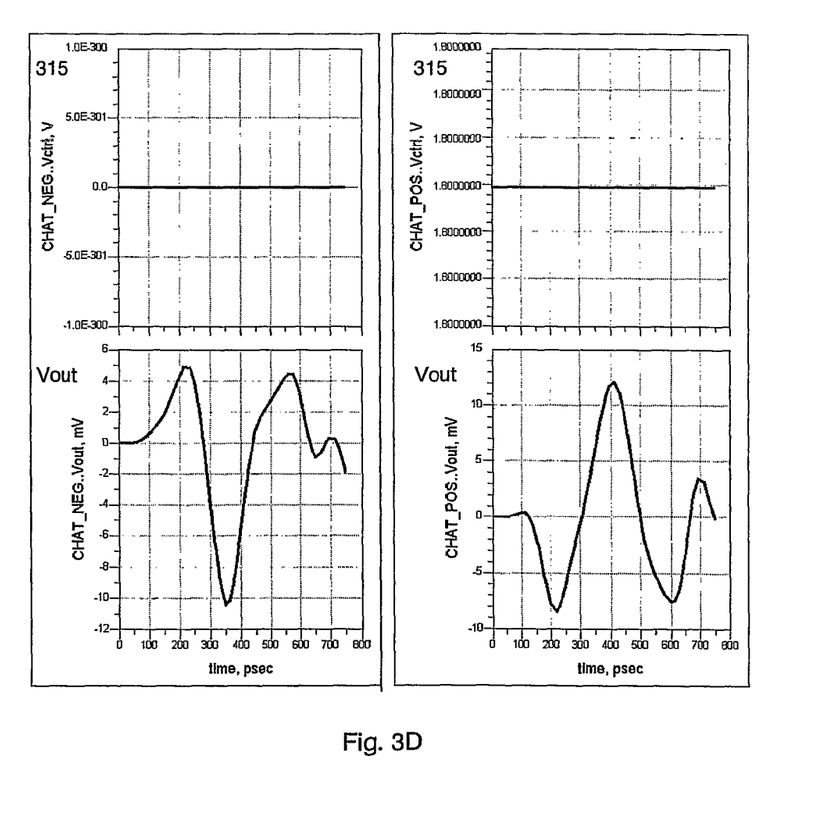
FIG. 3D illustrates the performance of a BPSK modulator constructed in accordance with the present invention.

FIG. 3D illustrates the performance of a BPSK modulator constructed in accordance with the present invention. When the input control voltage is in low level (for example 0V), M3A and M4 is off and M4B is on, thus the Gaussian pulse with positive polarity is output. On the other hand, when the input control voltage is in high level (for example 1.8V), M3A is on, M4 and M4B is off, thus the Gaussian pulse with negative polarity is output.

UWB Driver Amplifier Circuit

Figure 4:
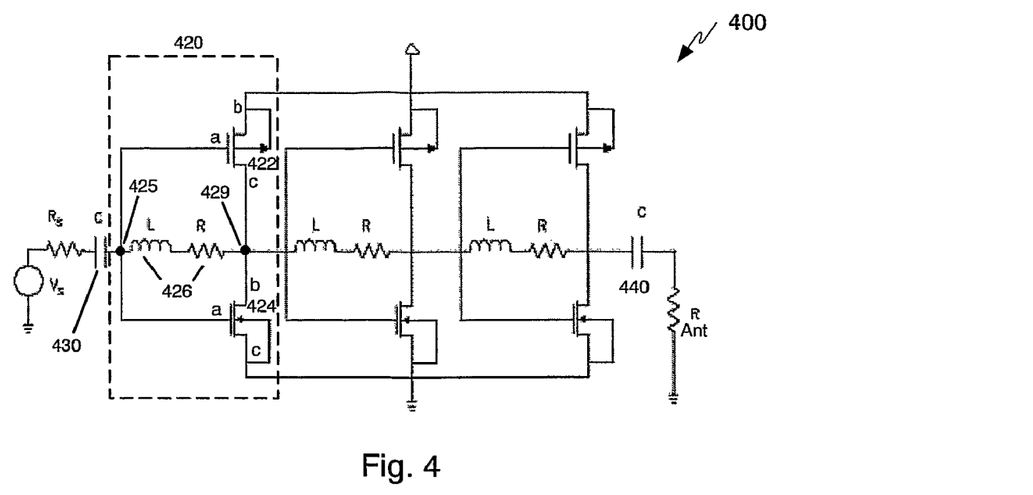
FIG. 4 illustrates an ultra wideband driver amplifier circuit in accordance with one embodiment of the present invention.

FIG. 4A illustrates an ultra wideband driver amplifier in accordance with one embodiment of the present invention. The UWB driver amplifier is used to amplify the modulated UWB pulse, as well as to provide a broadband impedance match between the modulator and the antenna.

As shown in FIG. 4A, the UWB driver amplifier 400 includes one or more amplifier stages 420, each amplifier stage including parallel coupled first and second amplifier stage transistors 422 and 424. Each of the amplifier stage transistors 422 and 424 has first, second, and third terminals, wherein the first (e.g., gate) terminals 422a and 424a are coupled together to form a first node 425, and the third (drain) terminal 422c of the first transistor and the second (drain) terminal 424b of the second transistor are coupled together at a second node 429. Coupled between the first and second nodes 425 and 429 is an inductive-resistive network 426 which provides shunt feedback. In essence, each stage is configured as a shunt feedback common source amplifier stage with resistor and inductor feedback, in which PMOS-NMOS current reuse technique is employed to improve the gm and gain without sacrificing the bandwidth.

One or more of the amplifier stages may be used to provide sufficient signal gain for transmission. Three cascaded stages are shown in the illustrated embodiment, although fewer or more stages may be used in alternative embodiments. Preferably, the gate peripheries of the first and second transistors 422 and 424 are substantially the same, although different gate peripheries may be employed in alternative embodiments. Additionally, each amplifier stage may have the same total periphery, or alternatively, different stages may have different total gate peripheries, depending upon the design technique. For example, in one embodiment the UWB drive amplifier may employ amplifier stages of successively increasing gate peripheries in order to provide a higher linear output power (IP3) characteristic. In another embodiment, the UWB driver amplifier may employ amplifier stages of substantially the same gate periphery to provide an extremely wide impedance match. These and other design approaches may be adopted in amplifier's architecture.

Further included in the exemplary UWB driver amplifier embodiment are input and output capacitors 420 and 430, the values of which may be selected to provide DC blocking and/or AC coupling, the latter being used to attenuate any output signals below the USB spectrum low end (3.1 GHz in the US) to a sufficient degree in order to comply with UWB signal emission regulations.

Additionally, it is well known that the position of the poles and zeros determine the bandwidth and gain of the amplifier. The bandwidth of the UWB driver amplifier is improved by using dominant pole bandwidth enhancement technique which can increase the bandwidth without compromising gain. The small signal equivalent circuit analysis of each stage amplifier shows reveals 2 zeros and 3 poles. Among them, two zeros and two poles remain close to the origin, but the position of the dominant pole is very far away from the origin. This pole arrangement helps to increase the bandwidth of the amplifier without compromising on gain.

In a specific embodiment, a three-stage UWB driver amplifier was designed using 0.18 um CMOS technology. Biasing conditions were simulated at 1.8V @ 18 mA. The performance parameters are summarized in Table I below.

TABLE I

| Property | Value |
|---|---|
| −3 dB bandwidth | 2.2-10.1 GHz |
| S(1, 1) | −2.5 to 3.6 dB in 2.2-10.1 GHz |
| S(1, 2) | <−46 dB in 2.2-10.1 GHz |
| S(2, 1) or Power gain | 21 dB in 2.2-10.1 GHz |
| S(2, 2) | <−5 dB in 2.2-10.1 GHz |
| IIP3 | −8 dBm |
| Output NF @ 50 Ohm | <3.5 dB in 2.2-10.1 GHz |
| Voltage Gain | 15 dB in 2.2-10.1 GHz |
| I@V | 18.4 mA @ 1.8 V |
| Stability Factor, K | >7.8 in 2.2-10.1 GHz |
| Stability measurement | >1.0 in 2.2-10.1 GHz |

UWB Transmitter

Figure 5A:
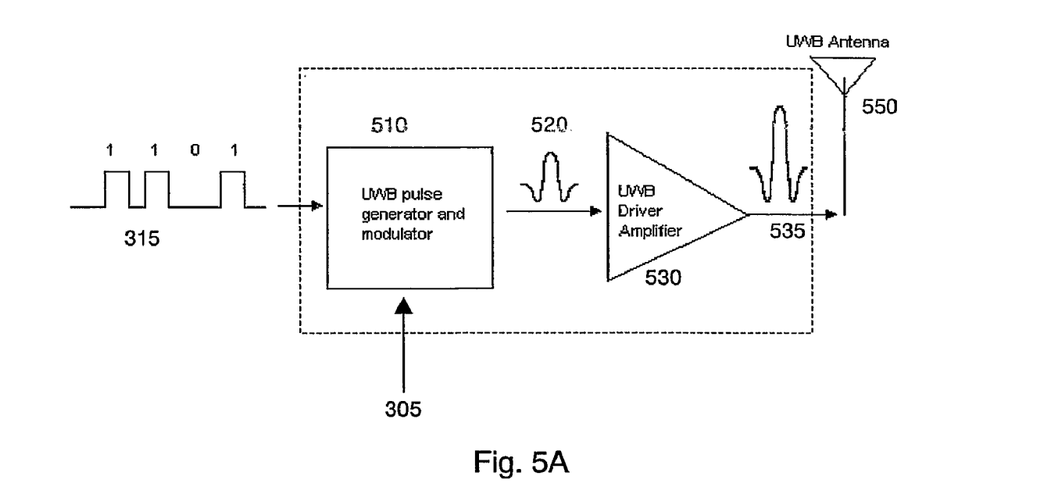
FIG. 5A illustrates a simplified block diagram a transmitter circuit constructed in accordance with the present invention.

FIG. 5A illustrates a simplified block diagram a transmitter circuit constructed in accordance with the present invention. The particular transmitter employs pulse amplitude modulation to communicate baseband data, although BPSK, PPM or any type of modulation technique may be used in accordance with the present invention.

As shown in FIG. 5A, an input signal 305 and control signal 315 are supplied to a UWB pulse amplitude modulator 510, an exemplary embodiment of which is shown in FIG. 3B. The pulse amplitude modulator 510 outputs Gaussian pulses 520, the amplitude of which is modulated by the level of the control signal 315. The modulated Gaussian pulse 520 is supplied to the driver amplifier circuit 530, an exemplary embodiment of which is shown in FIG. 4. The driver amplifier outputs an amplified Gaussian pulse 535, and additionally provides broadband matching to the UWB antenna 550 gain for maximum power transfer and UWB signal transmission efficiency.

Figure 5B:
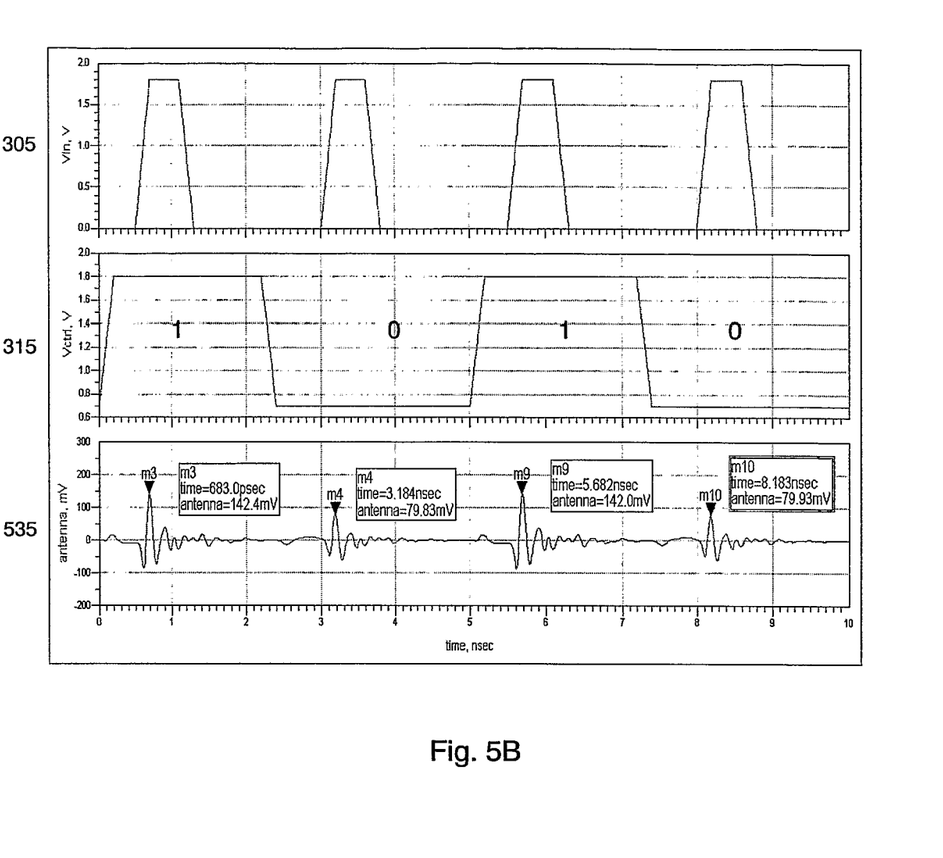
FIG. 5B illustrates the performance of an ultra wideband transmitter constructed in accordance with the present invention.

FIG. 5B illustrates the input/clock, control/modulation and output pulse signals of an UWB transmitter employing the pulse amplitude modulator of FIG. 3B and the driver amplifier circuit shown in FIG. 4. The input/clock signal generates the UWB Gaussian pulse. The control/modulation signal controls the amplitude of the pulse. At the antenna output, a high amplitude Gaussian pulse with a peak to peak voltage of 142 mV to −80 mV is generated by a high control signal voltage and a low amplitude Gaussian pulse with a peak to peak voltage of 79 mV to −50 mV is generated by a low control voltage.

As shown, a serial data stream of 1 0 1 0 is transmitted. A high amplitude UWB Gaussian pulse is generated when a digital "1" is transmitted and a low amplitude UWB Gaussian pulse is generated when a digital "0" is transmitted. Advantageously, the system simulation indicated that even with additional distortion applied to the signal after transmission, the demodulation performance was not affected significantly when the receiving and transmitting antennas are substantially the same. The power consumption of the PAM UWB transmitter is 0.043 W.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A Gaussian pulse generator circuit, comprising:
a squaring stage, comprising a first transistor having first, second and third terminals and configured to operate in the saturation region;
an exponential stage, comprising a second transistor having a first terminal coupled to the second terminal of the first transistor, a second terminal, and a third terminal, the second transistor configured to operate in the sub-threshold region; and
a second-order derivative stage, comprising an capacitive-inductive network coupled to the second terminal of the second transistor, and an output terminal, wherein, when a load is coupled to the output terminal, the real resistance of the load combines with the capacitive-inductive network to provide a second order derivative response.

2. The Gaussian pulse generator circuit of claim 1, wherein the squaring stage further comprises a first resistor coupled to the second terminal of the first transistor.

3. The Gaussian pulse generator circuit of claim 1, wherein the exponential stage further comprises:
a second resistor coupled to the first terminal of the second transistor; and
a third transistor having a first terminal coupled to the second terminal of the first transistor, a second terminal coupled to the first terminal of the second transistor, and a third terminal.

4. The Gaussian pulse generator circuit of claim 3, wherein the first and third transistors comprise MOSFET transistors, and the second transistor comprises a BJT transistor.

5. The Gaussian pulse generator circuit of claim 3, wherein the first, second, and third transistors comprise MOSFET transistors.

6. The Gaussian pulse generator circuit of claim 1, wherein an output voltage is calculated as:

$$V_{out}(t) \approx -\frac{2k_e R_L LC e^{5V_{th}/4}}{\lambda V_{th}}\left[1 - \frac{2}{\lambda V_{th}}\left(V_{in}(t) - \frac{3V_{th}}{2}\right)^2\right]e^{-\frac{\left(V_{in}(t) - \frac{3V_{th}}{2}\right)^2}{\lambda V_{th}}}$$

where $k_e$ and $\lambda$ are parameters of the exponential I-V characteristic equation: $I_{DS} = k_e e^{V_{GS}/\lambda}$, $R_L$ is the load real resistance, and C and L are respective values of the capacitance and inductance of the capacitive-inductive network.

7. The Gaussian pulse generator circuit of claim 1, wherein the circuit is an integrated circuit monolithically formed using a BiCMOS semiconductor process.

8. The Gaussian pulse generator circuit of claim 1, wherein the circuit is an integrated circuit monolithically formed using a CMOS semiconductor process.

9. An ultra wideband modulator circuit, comprising:
a Gaussian pulse generator circuit, comprising:
a squaring stage, comprising a first transistor having first, second and third terminals, the first transistor configured to receive an input signal at the first terminal and to operate in the saturation region;
an exponential stage, comprising a second transistor having a first terminal coupled to the second terminal of the first transistor, a
a second-order derivative stage, comprising a first capacitive-inductive network coupled to the second terminal of the second transistor, and an output terminal, wherein, when a load is coupled to the output terminal, the real resistance of the load combines with the first capacitive-inductive network to provide a second order derivative response; and
a modulation control circuit having an input configured to receive a control signal and an output coupled to the Gaussian pulse generator circuit, the modulation control circuit configured to modulate the biasing condition of the exponential stage as a function of the input control signal.

10. The ultra wideband modulator circuit of claim 9, wherein the squaring stage further comprises a first resistor coupled to the second terminal of the first transistor.

11. The ultra wideband modulator circuit of claim 9, wherein the exponential stage further comprises a third transistor having a first terminal coupled to the second terminal of the first transistor, a second terminal coupled to the first terminal of the second transistor, and a third terminal.

12. The ultra wideband modulator circuit of claim 11, wherein the modulation control circuit comprises:
a fourth transistor having a control port for receiving a control signal, a first port and a second port; and
a current mirror circuit having a first port coupled to the first port of the fourth transistor, a second port coupled to the control port of the second transistor, and a third port coupled to the inductor-capacitor network.

13. The ultra wideband modulator circuit of claim 12, wherein the first, third and fourth transistors each comprise a MOSFET transistor, and the second transistor comprises a BJT transistor.

14. The ultra wideband modulator circuit of claim 12, wherein each of the first, second, third and fourth transistors comprise a MOSFET transistor, and wherein the circuit is an integrated circuit monolithically formed using a CMOS process.

15. The ultra wideband modulator circuit of claim 11, wherein the exponential stage further comprises:
a fourth transistor having a first terminal coupled to the third terminal of the first transistor, a second terminal, and a third terminal coupled to the third terminal of the second transistor; and
a fifth transistor having a first terminal coupled to the second terminal of the second transistor, a second terminal coupled to the third terminal of the first transistor, and a third terminal;
wherein the second and fourth transistors operate in a differential manner.

16. The ultra wideband modulator circuit of claim 15, wherein the second order derivative circuit further comprises a second-order derivative stage coupled to the second terminal of the second transistor and to the output terminal, wherein, (i) when a load is coupled to the output terminal and the second transistor is conducting, the real resistance of the load combines with the first capacitive-inductive network to provide a second order derivative response, and (ii) when a load is coupled to the output terminal and the fourth transistor is conducting, the real resistance of the load combines with the second capacitive-inductive network to provide a second order derivative response.

17. The ultra wideband modulator circuit of claim 16, wherein the modulation control circuit comprises:
a sixth transistor having a first terminal configured to receive the control signal, a second terminal and a third terminal;
a seventh transistor interposed between the first capacitive-inductive network and the output terminal, the seventh transistor having a first terminal coupled to the first terminal of the sixth transistor, a second terminal coupled to the first capacitive-inductive network and a third terminal coupled to the output terminal; and
an eighth transistor interposed between the second capacitive-inductive network and the output terminal, the eighth transistor having a first terminal coupled to the second terminal of the seventh transistor, a second terminal coupled to the output terminal, and a third terminal coupled to the second capacitive-inductive network.

18. The ultra wideband modulator circuit of claim 17, wherein the first, third, fifth, sixth and seventh transistors are MOSFET transistors and the second and fourth transistors are BJT transistors.

19. The ultra wideband modulator circuit of claim 18, wherein the circuit is an integrated circuit monolithically formed using a BiCMOS semiconductor process.

20. The ultra wideband modulator circuit of claim 9, wherein the circuit is an integrated circuit monolithically formed using a BiCMOS process.

21. An ultra wideband transmitter circuit, comprising:
an ultra wideband modulator circuit, comprising:
a squaring stage, comprising a first transistor having first, second and third terminals and configured to operate in the saturation region;
an exponential stage, comprising a second transistor having a first terminal coupled to the second terminal of the first transistor, a second terminal, and a third terminal, the second transistor configured to operate in the subthreshold region;
a second-order derivative stage, comprising an capacitive-inductive network coupled to the second terminal of the second transistor, and an output terminal; and
a modulation control circuit having an input configured to receive a modulation control signal and an output coupled to the Gaussian pulse generator circuit, the modulation control circuit configured to modulate the biasing condition of the exponential stage as a function of the modulation control signal; and
a driver amplifier having an input coupled to the output terminal of the second-order derivative stage and an output, the driver amplifier providing the real resistance component to the capacitive-inductive network to produce a second-order derivative signal at the driver amplifier input, the driver amplifier comprising one or more serial-coupled amplifier stages, wherein each amplifier stage comprises:
parallel coupled first and second amplifier stage transistors, each of the first and second amplifier stage transistors having first, second and third terminals, wherein the first terminals of the first and second amplifier stage transistors are coupled together at a first node, and the third terminal of the first amplifier stage transistor and the second terminal of the second amplifier stage transistor are coupled together at a second node; and
a feedback network coupled between the first and second nodes, the feedback network comprising an inductive element and a resistive element.

22. The ultra wideband transmitter circuit of claim 21, wherein the squaring stage further comprises a first resistor coupled to the second terminal of the first transistor.

23. The ultra wideband transmitter circuit of claim 21, wherein the exponential stage further comprises a third transistor having a first terminal coupled to the second terminal of the first transistor, a second terminal coupled to the first terminal of the second transistor, and a third terminal.

24. The ultra wideband transmitter circuit of claim 23, wherein the modulation control circuit comprises:
a fourth transistor having a control port for receiving a modulation control signal, a first port and a second port; and
a current mirror circuit having a first port coupled to the first port of the fourth transistor, a second port coupled to the control port of the second transistor, and a third port coupled to the inductor-capacitor network.

25. The ultra wideband transmitter circuit of claim 24, wherein the first, third and fourth transistors each comprise a MOSFET transistor, and the second transistor comprises a BJT transistor.

26. The ultra wideband modulator circuit of claim 21, wherein the exponential stage further comprises:
a fourth transistor having a first terminal coupled to the third terminal of the first transistor, a second terminal, and a third terminal coupled to the third terminal of the second transistor; and
a fifth transistor having a first terminal coupled to the second terminal of the second transistor, a second terminal coupled to the third terminal of the first transistor, and a third terminal;
wherein the second and fourth transistors operate in a differential manner.

27. The ultra wideband transmitter circuit of claim 26, wherein the second order derivative circuit further comprises a second-order derivative stage coupled to the second terminal of the second transistor and to the output terminal, wherein, (i) when a load is coupled to the output terminal and the second transistor is conducting, the real resistance of the load combines with the first capacitive-inductive network to provide a second order derivative response, and (ii) when a load is coupled to the output terminal and the fourth transistor is conducting, the real resistance of the load combines with the second capacitive-inductive network to provide a second order derivative response.

28. The ultra wideband transmitter circuit of claim 27, wherein the modulation control circuit comprises:
a fifth transistor having a first terminal configured to receive the modulation control signal, a second terminal and a third terminal;
a sixth transistor interposed between the first capacitive-inductive network and the output terminal, the sixth transistor having a first terminal coupled to the first terminal of the fifth transistor, a second terminal coupled to the first capacitive-inductive network and a third terminal coupled to the output terminal; and
a seventh transistor interposed between the second capacitive-inductive network and the output terminal, the seventh transistor having a first terminal coupled to the second terminal of the fifth transistor, a second terminal coupled to the output terminal, and a third terminal coupled to the second capacitive-inductive network.

29. The ultra wideband transmitter circuit of claim 21, further comprising a capacitor having a first port for receiving an input signal and a second port coupled to the first node of the first of the one or more amplifier stages.

30. The ultra wideband transmitter circuit of claim 29, further comprising a capacitor having a first port coupled to second node of the last of the one or more amplifier stages and a second port for providing an output signal.

31. The ultra wideband transmitter circuit of claim 21, wherein the gate periphery of the first and second amplifier stage transistors within the same amplifier stage is substantially matched.

32. The ultra wideband transmitter circuit of claim 21, wherein the first and second amplifier stage transistors of different amplifier stages are of different gate peripheries.

33. The ultra wideband transmitter circuit of claim 21, wherein the first and second amplifier stage transistors of the different amplifier stages are of substantially the same gate peripheries.

34. The ultra wideband transmitter circuit of claim 21, wherein the circuit is an integrated circuit monolithically formed using a BiCMOS process.

35. The ultra wideband transmitter circuit of claim 21, wherein the circuit is an integrated circuit monolithically formed using a CMOS process.

* * * * *